United States Patent
Liang

(10) Patent No.: US 10,339,953 B2
(45) Date of Patent: Jul. 2, 2019

(54) HOWLING DETECTION METHOD AND APPARATUS

(71) Applicant: TENCENT TECHNOLOGY (SHENZHEN) COMPANY LIMITED, Shenzhen, Guangdong (CN)

(72) Inventor: Junbin Liang, Shenzhen (CN)

(73) Assignee: TENCENT TECHNOLOGY (SHENZHEN) COMPANY LIMITED, Guangdong (CN)

( * ) Notice: Subject to any disclaimer, the term of this patent is extended or adjusted under 35 U.S.C. 154(b) by 0 days.

(21) Appl. No.: 16/043,837

(22) Filed: Jul. 24, 2018

(65) Prior Publication Data

US 2018/0330744 A1 Nov. 15, 2018

Related U.S. Application Data

(63) Continuation of application No. PCT/CN2017/087878, filed on Jun. 12, 2017.

(30) Foreign Application Priority Data

Jul. 20, 2016 (CN) .......................... 2016 1 0576227

(51) Int. Cl.
  *G10L 21/0232* (2013.01)
  *G10L 25/45* (2013.01)
  *G10L 25/21* (2013.01)
  *H04R 3/04* (2006.01)

(52) U.S. Cl.
  CPC .......... *G10L 21/0232* (2013.01); *G10L 25/21* (2013.01); *G10L 25/45* (2013.01); *H04R 3/04* (2013.01)

(58) Field of Classification Search
  CPC ..... G10L 21/0232; G10L 25/45; G10L 25/21; H04R 3/04

USPC ......................................................... 381/94.3
See application file for complete search history.

(56) References Cited

U.S. PATENT DOCUMENTS

| 2015/0104039 A1 | 4/2015 | Lee | |
|---|---|---|---|
| 2016/0157037 A1* | 6/2016 | Verity | .................... H04B 1/715 381/94.2 |

FOREIGN PATENT DOCUMENTS

| CN | 103544961 A | 1/2014 |
|---|---|---|
| CN | 104871436 A | 8/2015 |
| CN | 105308985 A | 2/2016 |
| CN | 105516876 A | 4/2016 |

OTHER PUBLICATIONS

International Search Report for PCT/CN2017/087878 dated Aug. 8, 2017 [PCT/ISA/210].

* cited by examiner

Primary Examiner — Paul Kim
(74) Attorney, Agent, or Firm — Sughrue Mion, PLLC

(57) ABSTRACT

A howling detection method is provided. A window separation processing is processed on an audio signal to obtain a plurality of analysis windows. A signal energy indicator value of each preset frequency in at least one analysis window is obtained by using a preset perceptual coefficient corresponding to each frequency, to obtain a perceptual energy indicator value of each frequency, the preset perceptual coefficient corresponding to each frequency indicating a sensitivity of a human ear to a sound of each frequency. It is determined whether howling occurs according to the perceptual energy indicator value of each frequency in the at least one analysis window.

20 Claims, 4 Drawing Sheets

HOWLING DETECTION METHOD AND APPARATUS

CROSS-REFERENCE TO RELATED APPLICATIONS

This application is a continuation of International Application No. PCT/CN2017/087878, filed on Jun. 12, 2017 in the Chinese Patent Office, which claims priority from Chinese Patent Application No. 201610576227.X, filed with the Chinese Patent Office on Jul. 20, 2016 and entitled "HOWLING DETECTION METHOD AND APPARATUS", the disclosures of which are incorporated herein by reference in their entireties.

FIELD

Methods and apparatuses consistent with exemplary embodiments relate to audio processing, and in particular, to a howling detection method and apparatus.

BACKGROUND

Howling refers to a sharp and raspy sound that appears during the use of a sound pickup device or a pickup (for example, a microphone). Howling occurs because a sound output by a player (for example, a sounder and a horn) is constantly captured by the pickup to return to the pickup and is output after being enlarged by a power amplifier of the player in a repeated process, so as to generate a sound positive feedback phenomenon. An existing howling suppression solution determines whether howling occurs by detecting energy of an output signal, and suppresses the howling based on a result of determination.

SUMMARY

One or more exemplary embodiments provide a howling detection method and apparatus. Sensitivity of human ears to sounds with different frequencies is considered in a howling detection solution to generate a more accurate detection result.

According to an aspect of an exemplary embodiment, there is provided a howling detection method. A howling detection method is provided. A window separation processing is processed on an audio signal to obtain a plurality of analysis windows. A signal energy indicator value of each preset frequency in at least one analysis window is obtained by using a preset perceptual coefficient corresponding to each frequency, to obtain a perceptual energy indicator value of each frequency, the preset perceptual coefficient corresponding to each frequency indicating a sensitivity of a human ear to a sound of each frequency. It is determined whether howling occurs according to the perceptual energy indicator value of each frequency in the at least one analysis window.

According to another aspect of an exemplary embodiment, there is provided a howling detection apparatus. The apparatus includes at least one processor and at least one memory. The at least one memory stores a series of computer readable instructions being capable of causing the at least one processor to perform: performing window separation processing on an audio signal to obtain a plurality of analysis windows, obtaining a signal energy indicator value of each preset frequency in at least one analysis window by using a preset perceptual coefficient corresponding to each frequency, to obtain a perceptual energy indicator value of each frequency, the preset perceptual coefficient corresponding to each frequency indicating a sensitivity of a human ear to a sound of each frequency, and determining whether howling occurs according to the perceptual energy indicator value of each frequency in the at least one analysis window.

According to still another aspect of an exemplary embodiment, there is provided a non-transitory computer readable storage medium. The storage medium stores a series of computer readable instructions being capable of causing one or more processors to perform: performing window separation processing on an audio signal to obtain a plurality of analysis windows, obtaining a signal energy indicator value of each preset frequency in at least one analysis window by using a preset perceptual coefficient corresponding to each frequency, to obtain a perceptual energy indicator value of each frequency, the preset perceptual coefficient corresponding to each frequency indicating a sensitivity of a human ear to a sound of each frequency, and determining whether howling occurs according to the perceptual energy indicator value of each frequency in the at least one analysis window.

BRIEF DESCRIPTION OF THE DRAWINGS

These and/or other aspects of the disclosure will become apparent and more readily appreciated from the following description of the exemplary embodiments, taken in conjunction with the accompanying drawings, in which.

DETAILED DESCRIPTION

For brief and intuitive description, the following describes the solutions of the disclosure by describing several exemplary embodiments. However, not all implementations are shown herein. Details in the exemplary embodiments are presented only to help the reader understand the solutions of the disclosure, and implementations of the technical solutions of the disclosure may not be limited by these details. To avoid making the solutions of the disclosure obscure, some implementations are not described in detail, but only a framework is given. In the following description, "including" means "including, but not limited to", and "according to . . . " means "at least according to . . . , but the basis is not limited to . . . ". "Including" in the specification and claims means at least including to some degree, which should be explained as including the following mentioned features as well as other features.

Sensitivity of human ears to sounds with different frequencies is considered in a detection solution in the exemplary embodiments. Weighting processing is performed on a signal energy indicator value of each frequency of an audio signal. A howling detection is performed according to the weighted signal energy indicator value (or a perceptual energy indicator value), so that a howling detection result well fits into (or corresponds to) a hearing characteristic of human ears and becomes more accurate.

Figure 1:
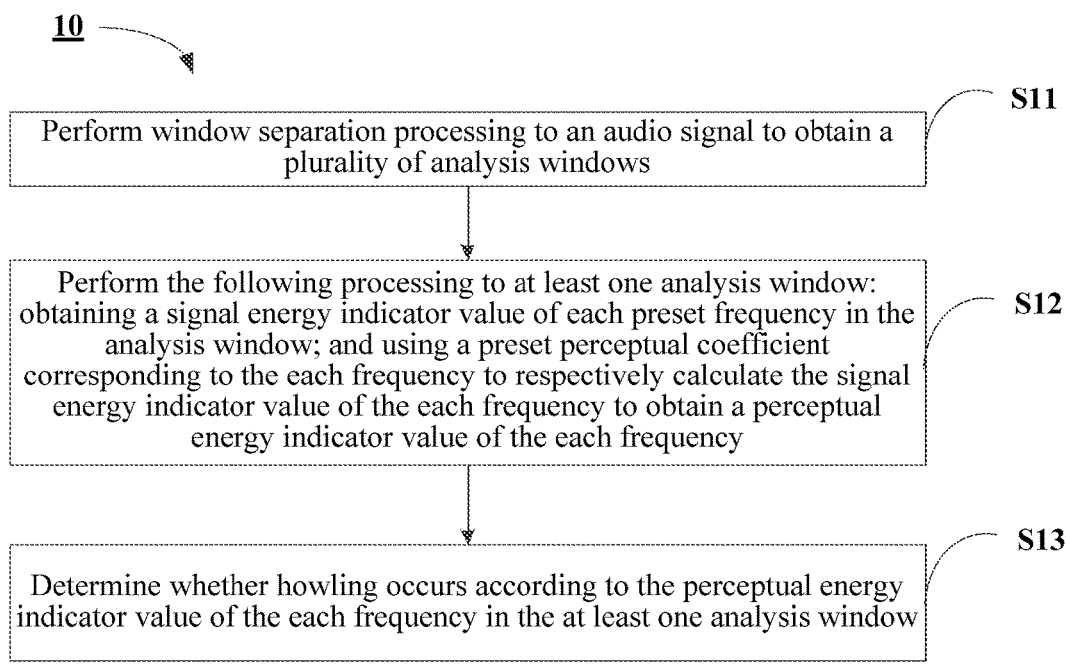
FIG. 1 is a flowchart of a howling detection method according to an exemplary embodiment.

FIG. 1 is a flowchart of a howling detection method 10 according to an exemplary embodiment. The method 10 may include the following steps:

Step S11: Perform window separation processing on an audio signal to obtain a plurality of analysis windows.

Step S12: Perform the following processing with respect to at least one analysis window: obtaining a signal energy indicator value of each preset frequency in the analysis window; and using a preset perceptual coefficient corresponding to each frequency to respectively calculate the signal energy indicator value of each frequency to obtain a perceptual energy indicator value of each frequency.

Step S13: Determine whether howling occurs according to the perceptual energy indicator value of each frequency in the at least one analysis window.

In this way, the method performs calculation with respect to a detected energy of each frequency of an audio according to a psychological acoustics perceptual factor, so as to well fit into a human-ear perceptual characteristic and make a howling detection result more accurate.

Solutions of the exemplary embodiments can be applied to a scenario using a pickup device and a playing device, for example, a voice video call, a broadcast, a meeting, an on-site activity using a loudspeaker, and the like.

In some examples, audio processing devices can merely process a signal with a limited length. Thus, window separation processing is performed on an audio signal in the step S11 to generate a section of audio signal, that is, a plurality of analysis windows. The audio signal in an analysis window is processed each time. The window separation processing uses an analysis window with, for example, a 10 ms or 20 ms duration. A window function may use a Hanning window, a Hamming window, and the like.

The signal energy indicator value refers to a value indicating an energy of the audio signal. In some examples, the signal energy indicator value may be a signal energy, a signal power, and the like. The signal energy or the power can be obtained by a signal detection. In some examples, the signal energy indicator value may further be a value obtained by performing a preset algorithm processing on the signal energy or the signal power. A specific algorithm can be set appropriately, a manner of which is not limited herein.

Howling is detected subjectively, and reactions of human ears to sounds with a same energy but different frequencies are different. For example, some frequencies are located at a sensitive frequency band of the human ears. A detection value of a sound energy on a frequency in the sensitive frequency band may not be high, but the human ears can feel the howling. The exemplary embodiments use the preset perceptual coefficient of each frequency to perform weighting on the signal energy indicator value of each frequency to obtain the perceptual energy indicator value. The perceptual energy indicator value may refer to a strength of a sound felt by the human ears.

Each frequency corresponds to a frequency value or a section of a frequency band. For example, each frequency may correspond to frequencies 0, 1, 2, . . . , M. M is an integer larger than 1. Frequency 1 may correspond to a frequency with a 100-200 Hz frequency value. However, this is only an example and the disclosure is not limited thereto. A number of frequencies (e.g., a value of M) selected from the exemplary embodiments may be different and may correspond to different frequency values or frequency bands. The number of frequencies and the frequency value of each frequency (which refers to, when the frequency corresponds to the frequency band, a central frequency value of a corresponding frequency band) may be determined according to embodiments. For example, a relatively higher number of frequencies can be selected at a sensitive frequency band of the human ears. The more concentrated the selected frequencies are, the more accurate the detection result is, which certainly means more calculation and more complex processing.

The perceptual coefficient of each frequency indicates sensitivity of human ears to a sound of each frequency, which may be set according to experiences, or may be determined according to experiments, or may be determined in other ways.

In some examples, it may be set that for any pair of a first frequency and a second frequency in a sensitive frequency range of the human ears, for example, a range of 1000 Hz to 4000 Hz, when the first frequency is higher than the second frequency, a perceptual coefficient corresponding to the first frequency is higher than a perceptual coefficient corresponding to the second frequency. A value of the perceptual coefficient may be set in any appropriate manner.

In some examples, a relationship between the set perceptual coefficient and each frequency fits a regulation of an equal loudness curve. The equal loudness curve is a curve used to describe a relationship between a sound pressure level and a sound wave frequency in an equal loudness condition. The loudness indicates a degree of how loud a sound is. The loudness of a sound changes with the strength of the sound but is further affected by the frequency, that is, sounds with same strength but different frequencies create different hearing perceptions for human ears. International organization for acoustics standards detects the acoustics equal loudness curve and determines a sound pressure level of a pure sound in different frequencies that needs to be reached so that a hearer can obtain a consistent hearing loudness. The perceptual coefficient may be set with reference to the equal loudness curve. For example, the perceptual coefficient may be calculated and obtained based on equal loudness curve data of a psychological acoustics of a BS3383 standard BS 3383 Specification for normal equal-loudness level contours for pure tones under free-field listening conditions.

The following describes a calculation method that uses a linear interpolation method to perform interpolation to current equal loudness curve data to obtain a loudness value of the preset frequency.

$$afy(\text{freq}) = af(k-1) + (\text{freq} - ff(k-1)) \times (af(k) - af(k-1))/(ff(k) - ff(k-1)); \quad \text{(Formula 1)}$$

$$bfy(\text{freq}) = bf(k-1) + (\text{freq} - ff(k-1)) \times (bf(k) - bf(k-1))/(ff(k) - ff(k-1)); \quad \text{(Formula 2)}$$

$$cfy(\text{freq}) = cf(k-1) + (\text{freq} - ff(k-1)) \times (cf(k) - cf(k-1))/(ff(k) - ff(k-1)); \quad \text{(Formula 3)}$$

$$\text{loud}(\text{freq}) = 4.2 + afyx(dB - cfy)/(1 + bfy*(dB - cfy)); \quad \text{(Formula 4)}$$

$$cof(\text{freq}) = (10^{\wedge}\text{loud}(\text{freq})/20)/1000; \quad \text{(Formula 5)}$$

Figure 2:
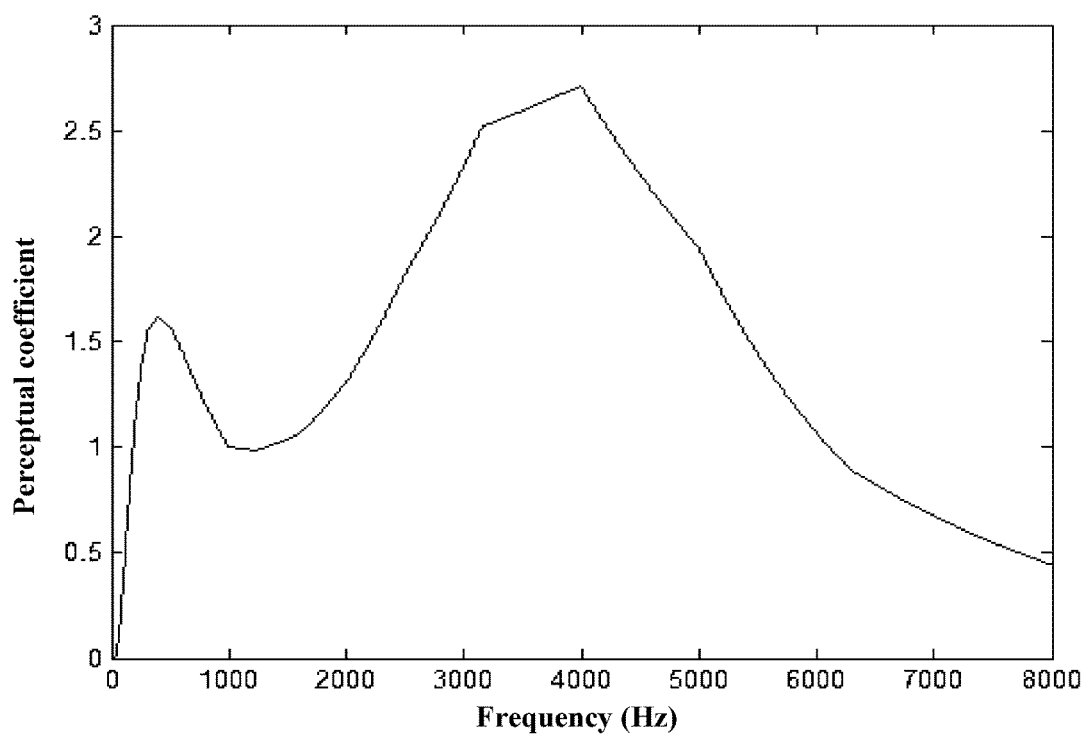
FIG. 2 is an example of a perceptual coefficient diagram obtained in an exemplary embodiment.

In the above, freq denotes a frequency value that is used to calculate the frequency of the perceptual coefficient (for example, a central frequency value of a frequency band corresponding to the frequency). k is a frequency number (e.g., a frequency value in a current equal loudness curve data excel). Each frequency number corresponds to a frequency value in the equal loudness curve data excel. The frequency value freq is smaller than or equal to the frequency value corresponding to the frequency number k in the equal loudness curve data excel and is greater than or equal to a frequency value corresponding to a frequency number k−1. ff, af, bf, and cf are data public in the equal loudness curve data excel of BS3383. loud (freq) indicates the loudness of the frequency freq. cof (freq) indicates a perceptual coefficient corresponding to the frequency freq. FIG. 2 is an example of a perceptual coefficient diagram obtained by the above calculations.

In some examples, in step S13, a howling indicator value of the analysis window is determined according to the perceptual energy indicator value of each frequency in the analysis window of the at least one analysis window. The howling indicator value of the analysis window is compared with a preset howling threshold. It is determined that the howling occurs based on a comparison result between the howling indicator value of a preset number of the analysis windows in the at least one analysis window and the howling threshold satisfying a preset condition.

The howling indicator value is used to indicate a probability that the howling occurs. The howling indicator value can be calculated and obtained by using a specified algorithm according to the perceptual energy indicator value of each frequency. In some examples, the higher the howling indicator value is, the higher the probability that the howling occurs is. In some other examples, the lower the howling indicator value is, the higher the probability that the howling occurs is.

For example, the howling indicator value may be spectral entropy of an audio signal. Specifically, the spectral entropy of the signal in the analysis window may be determined according to the perceptual energy indicator value of each frequency in the analysis window with reference to the following formula:

$$H = \sum_{m=0}^{M-1} Pd(m)\log\frac{1}{Pd(m)} \quad \text{(Formula 6)}$$

$$Pd(m) = p'(m) \bigg/ \sum_{j=0}^{M-1} p'(j)$$

represents a probability density function of the signal in the analysis window at a frequency m. $p'(m)=p(m)\times cof(fc(m))$ represents a perceptual energy indicator value of the signal in the analysis window at the frequency m. p(m) represents a signal energy indicator value of the frequency m in the analysis window. cof(fc(m)) represents a perceptual coefficient corresponding to the frequency m. fc(m) represents a central frequency of the frequency m, where m=0, 1, 2, . . . , M−1 and j=0, 1, 2, . . . , M−1. M is a sum of preset frequencies. That is, when there are M frequencies in total, a number m of each frequency may be 0, 1, 2, . . . , M−1 in sequence.

In other examples, the frequency can have other numbering methods, for example, the number m of each frequency may be 1, 2, 3, . . . , M. The foregoing formula may be correspondingly adjusted according to a numbering condition of the frequency.

In an example, the lower a spectral entropy value is, the higher the probability that the howling occurs is. Therefore, in this example, that the comparison result between the howling indicator value and the howling threshold satisfies the preset condition means that the spectral entropy value is lower than the howling threshold. In some examples, it is determined that the howling occurs based on the spectral entropy value of the signal in the analysis window being lower than the howling threshold. In other examples, accuracy of a detection result is increased by using comparison results of a plurality of analysis windows, that is, it is determined that the howling occurs based on the spectral entropy value of the signal in a preset number of the analysis windows in the at least one analysis window being lower than the howling threshold.

For another example, the howling indicator value may be a peak-to-average ratio of an audio signal. Specifically, the peak-to-average ratio of the audio signal in the analysis window may be determined according to the perceptual energy indicator value of each frequency in the analysis window:

$$Rpm=\text{Peak}/PM \quad \text{(Formula 7)}$$

Peak=Max(p'(m)) represents a peak value of the perceptual energy indicator value of each frequency in the analysis window. $p'(nm)=p(m)\times cof(fc(m))$ represents a perceptual energy indicator value of the signal in the analysis window at a frequency m. p(m) represents a signal energy indicator value of the frequency m in the analysis window. cof(fc(m)) represents a perceptual coefficient corresponding to the frequency m. fc(m) represents a central frequency of the frequency m.

$$PM = \frac{1}{M} \times \sum_{j=0}^{M-1} p'(m)$$

represents an average value of the perceptual energy indicator value of each frequency in the analysis window, where m=0, 1, 2, . . . , M−1 and J=0, 1, 2, . . . , M−1. M is a sum of preset frequencies.

In this example, the higher a value of the peak-to-average ratio is, the higher the probability that the howling occurs is. Therefore, in this example, that the comparison result between the howling indicator value and the howling threshold satisfies the preset condition means that the value of the peak-to-average ratio is higher than the howling threshold. In some examples, it is determined that the howling occurs of the peak-to-average ratio of the audio signal in the analysis window is higher than the howling threshold. In other examples, accuracy of a detection result is increased by using comparison results of a plurality of analysis windows, that is, it is determined that the howling occurs based on the peak-to-average ratio of the signal in a preset number of the analysis windows in the at least one analysis window being higher than the howling threshold.

When the comparison results of the plurality of analysis windows are used to determine whether the howling occurs, the plurality of analysis windows may be a plurality of constant analysis windows, or a plurality of inconstant analysis windows.

For example, it is determined that the howling occurs when a preset number of comparison results of constant analysis windows satisfy the preset condition.

For another example, a first counting value and a second counting value may be set, where a value of the first counting value and a value of the second counting value are respectively preset initial values. A preset first step length value is added to the first counting value in response to a comparison result between the howling indicator value of the analysis window and the howling threshold satisfying the preset condition. A preset second step length value is added to the second counting value in response to the comparison result between the howling indicator value of the analysis window and the howling threshold not satisfying the preset condition. It is determined that the howling occurs when the first counting value is equal to a preset first value. The first counting value is returned to the initial value when the second counting value reaches a preset second value. The first step length value, the second step length value, the first value, and the second value can be preset appropriately according to embodiments.

Figure 3:
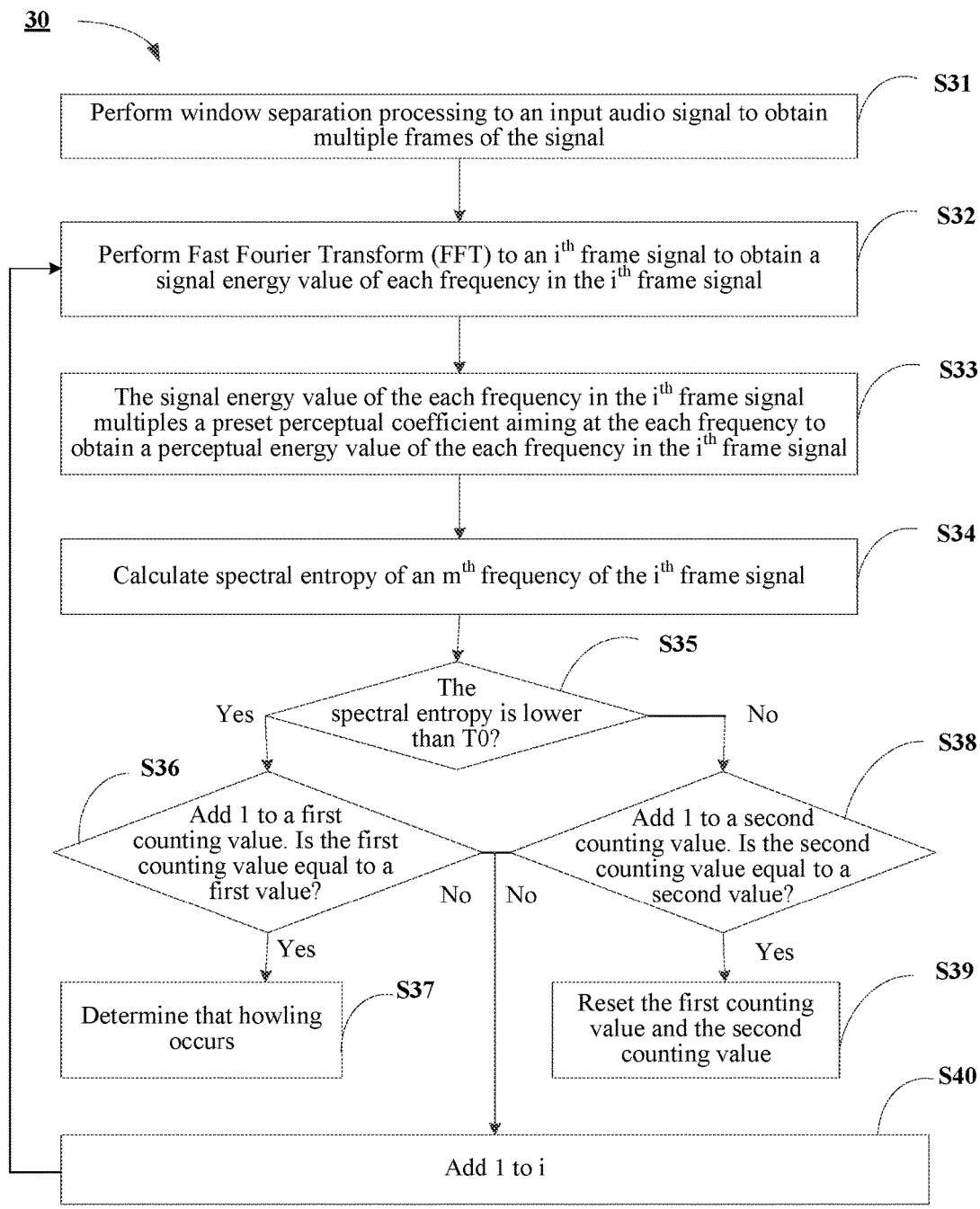
FIG. 3 is a flowchart of a howling detection method according to an exemplary embodiment.

FIG. 3 is a flowchart of a howling detection method 30 according to an exemplary embodiment.

Before performing the method 30, a first counting value and a second counting value may be set. Further, a variable i may be set. For example, initial values of the first counting value and the second counting value may be set as 0. An initial value of the variable i may be set as 1. The method 30 may include the following steps:

Step S31: Perform window separation processing on an input audio signal to obtain multiple frames of the signal.

Here, a frame of the signal refers to a signal in an analysis window.

Step S32: Perform Fast Fourier Transform (FFT) to an $i^{th}$ frame signal to obtain a signal energy value p(i, m) of each frequency in the $i^{th}$ frame signal, where m is a number of the frequency and M is a sum of frequencies.

Step S33: The signal energy value p(i,m) of each frequency in the $i^{th}$ frame signal multiples a preset perceptual coefficient aiming at each frequency to obtain a perceptual energy value p'(i, m) of each frequency.

$$p'(i,m)=p(i,m)*cof(fc(m)) \quad \text{(Formula 8)}$$

cof(fc(m)) is a perceptual coefficient corresponding to a frequency m and fc(m) is a central frequency value if the frequency m.

Step S34: Calculate spectral entropy H(i) of the $i^{th}$ frame signal.

$$H(i) = \sum_{m=0}^{M-1} Pd(i, m)\log\frac{1}{Pd(i, m)} \quad \text{(Formula 9)}$$

Pd(i, m) is a probability density function of an $m^{th}$ frequency of the $i^{th}$ frame signal, which can be calculated according to formula 10.

$$Pd(i, m) = p'(i, m) \Big/ \sum_{j=0}^{M-1} p'(i, j) \quad \text{(Formula 10)}$$

In this example, the spectral entropy H(i) is used as a howling indicator value. In other examples, a value obtained by using other calculation methods is used as the howling indicator value, for example, calculating an energy peak-to-average ratio of the frequency as the howling indicator value. A calculation method of the howling indicator value may be designed depending on embodiments. Any feasible algorithm can be used, which is not limited herein.

Step S35: Determine whether the spectral entropy H(i) is lower than a preset spectral entropy threshold T0. If yes, perform step S36. If not, perform step S38.

Step S36: Add 1 to a first counting value and determine whether the first counting value is equal to a preset first value. If yes, perform step S37. If not, perform step S40.

Step S37: Determine that howling occurs.

Step S38: Add 1 to a second counting value and determine whether the second counting value is equal to a preset second value. If yes, perform step S39. If not, perform step S40.

Step S39: Reset the first counting value and the second counting value.

Step S40: Add 1 to the variable i and perform step S32.

In the exemplary embodiments, the spectral entropy threshold T0, the preset first value, and the preset second value can be determined according to actual conditions or experiences. For example, the preset first value can be 3 and the preset second value can be 5.

Figure 4:
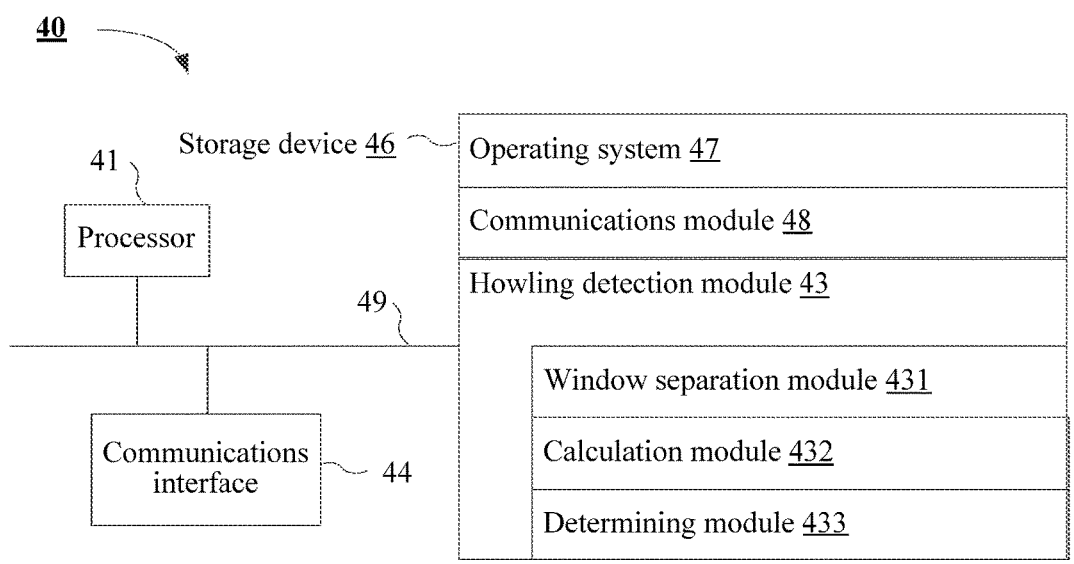
FIG. 4 is a schematic diagram of a howling detection apparatus according to an exemplary embodiment.

The exemplary embodiments further provide a howling detection apparatus. FIG. 4 is a schematic diagram of a howling detection apparatus according to an exemplary embodiment. The apparatus 40 may include a processor 41, a communications interface 44, a storage device 46, and a bus 49. The storage device 46 includes an operating system 47, a communications module 48, and a howling detection module 43.

There may be one or more processors 41, which may exist in a same physical device, or may be distributed in multiple physical devices.

The howling detection apparatus 40 can pass the input audio signal by using the communications interface 44 and provides a howling detection result to other devices by using the communications interface 44.

The howling detection module 43 may include a window separation module 431, a calculation module 432, and a determining module 433.

The window separation module 431 is configured to perform window separation processing to an audio signal to obtain a plurality of analysis windows.

The calculation module 432 is configured to perform the following processing to at least one of the plurality of analysis windows: obtaining a signal energy indicator value of each preset frequency in the analysis window; and using a preset perceptual coefficient corresponding to each frequency to respectively calculate the signal energy indicator value of each frequency to obtain a perceptual energy indicator value of each frequency, the perceptual coefficient corresponding to each frequency indicating sensitivity of human ears to a sound of each frequency.

The determining module 433 is configured to determine whether howling occurs according to the perceptual energy indicator value of each frequency in the at least one analysis window.

In some examples, the determining module 433 may perform:

determining a howling indicator value of the analysis window according to the perceptual energy indicator value of each frequency in the analysis window in the at least one analysis window, where the howling indicator value is used to indicate probability that the howling occurs;

comparing the howling indicator value of the analysis window with a preset howling threshold; and determining that the howling occurs based on a comparison result of a preset number of the analysis windows in the at least one analysis window satisfying a preset condition.

In some examples, the determining module 433 may perform:

determining that the howling occurs when a preset number of comparison results of constant analysis windows satisfy the preset condition.

The determining module 433 can use methods of the exemplary embodiments to calculate the howling indicator value, which is not repetitively described herein.

In some examples, the determining module 433 may perform:

setting a first counting value and a second counting value, wherein values of the first counting value and the second counting value are respectively preset initial values;

adding a preset first step length value to the first counting value in response to a comparison result between the howling indicator value of the analysis window and the howling threshold satisfying the preset condition; and adding a preset second step length value to the second counting value in response to the comparison result between the howling indicator value of the analysis window and the howling threshold not satisfying the preset condition, where the determining that the howling occurs includes:

determining that the howling occurs when the first counting value is equal to a preset first value; and returning the first counting value to the initial value when the second counting value reaches a preset second value.

Specific functions of the calculation module 432 and the determining module 433 may refer to corresponding methods and steps above, which is not repetitively described herein.

The technical solution according to the exemplary embodiments considers a psychological acoustics perceptual factor and performs weighting to a detected energy of each frequency of an audio, thereby detecting a howling more accurately based on a human-ear perceptual characteristic.

It should be noted that, all steps and modules in the foregoing procedures and structural diagrams are not necessary, some steps or modules may be omitted according to embodiments. An execution sequence of the steps is not fixed, and may be adjusted according to embodiments. Division of the modules is merely functional division for ease of description. In actual implementation, one module may be implemented separately by multiple modules, and functions of multiple modules may also be implemented by one same module. The modules may be located in a same device, and may also be located in different devices. In addition, "first" and "second" as described above are just for convenience of distinguishing two objects that have a same meaning, it does not mean that there is a substantial difference.

Hardware modules in the exemplary embodiments may be implemented in a hardware manner or a manner of a hardware platform and software. The foregoing software includes machine readable instructions stored in a non-volatile storage medium. Therefore, an exemplary embodiment can be embodied as a software product.

In each example, hardware may be implemented by specific hardware or hardware executing the machine readable instructions. For example, the hardware may be a specifically designed permanent circuit or logical device (for example, a dedicated processor, such as a field programmable gate array (FPGA) or an application specific integrated circuit (ASIC)) for completing a specific operation. The hardware may also include a programmable logical device or circuit (for example, including a general processor or another programmable processor) configured temporarily by software and configured to execute a specific operation.

The machine readable instructions corresponding to modules in the figure can make an operating system operated on a computer to complete part or all operations described herein. The operations may be: inserting into a memory disposed in an expansion board in the computer or writing into a memory disposed in an expansion unit connected to a computer non-volatile computer readable storage medium. A central processing unit (CPU) installed on the expansion board or the expansion unit can execute part or all actual operations according to the instructions.

The non-volatile computer readable storage medium includes a floppy disk, a hard disk, a magneto-optical disk, an optical disc (such as a compact disc read-only memory (CD-ROM), a compact disc recordable (CD-R), a compact disc rewritable (CD-RW), a digital video disc read-only memory (DVD-ROM), a digital video disc random access memory (DVD-RAM), a digital video disc rewritable (DVD-RW), and a digital video disc+ rewritable (DVD+RW)), a magnetic tape, a non-volatile storage card, and a read-only memory (ROM). Optionally, the program code may be downloaded form a server computer through a communications network.

At least one of the components, elements, modules or units represented by a block as illustrated in the drawings may be embodied as various numbers of hardware, software and/or firmware structures that execute respective functions described above, according to an exemplary embodiment. For example, at least one of these components, elements or units may use a direct circuit structure, such as a memory, a processor, a logic circuit, a look-up table, etc. that may execute the respective functions through controls of one or more microprocessors or other control apparatuses. Also, at least one of these components, elements or units may be specifically embodied by a module, a program, or a part of code, which contains one or more executable instructions for performing specified logic functions, and executed by one or more microprocessors or other control apparatuses. Also, at least one of these components, elements or units may further include or implemented by a processor such as a central processing unit (CPU) that performs the respective functions, a microprocessor, or the like. Two or more of these components, elements or units may be combined into one single component, element or unit which performs all operations or functions of the combined two or more components, elements of units. Also, at least part of functions of at least one of these components, elements or units may be performed by another of these components, element or units. Further, although a bus is not illustrated in the above block diagrams, communication between the components, elements or units may be performed through the bus. Functional aspects of the above exemplary embodiments may be implemented in algorithms that execute on one or more processors. Furthermore, the components, elements or units represented by a block or processing steps may employ any number of related art techniques for electronics configuration, signal processing and/or control, data processing and the like.

The "unit" or "module" used herein may be a hardware component, such as a processor or a circuit, and/or a software component that is executed by a hardware component such as a processor.

In conclusion, the scope of the claims should not be limited to the implementation in the foregoing described examples, but instead the specification should be considered as a whole and a broadest interpretation should be given.

What is claimed is:

1. A howling detection method performed by a howling detection apparatus, comprising:

performing, by at least one processor of the howling detection apparatus, window separation processing on an audio signal to obtain a plurality of analysis windows;

obtaining, by the at least one processor of the howling detection apparatus, a signal energy indicator value of each preset frequency in at least one analysis window by using a perceptual coefficient corresponding to each frequency, to obtain a perceptual energy indicator value of each frequency, the perceptual coefficient corresponding to each frequency indicating a sensitivity of a human ear to a sound of each frequency; and determining, by the at least one processor of the howling detection apparatus, whether howling occurs according to the perceptual energy indicator value of each frequency in the at least one analysis window.

2. The method according to claim 1, wherein in a pair of a first frequency and a second frequency in a sensitive frequency range of the human ear, a perceptual coefficient corresponding to the first frequency is higher than a perceptual coefficient corresponding to the second frequency, the first frequency being higher than the second frequency.

3. The method according to claim 1, wherein a relationship between the perceptual coefficient and each frequency corresponds to an equal loudness curve.

4. The method according to claim 1, wherein the determining comprises:

determining a howling indicator value of the at least one analysis window according to the perceptual energy indicator value of each frequency in the at least one analysis window, wherein the howling indicator value indicates a probability that the howling occurs;

comparing the howling indicator value of the at least one analysis window with a howling threshold; and determining that the howling occurs based on comparison results of a preset number of analysis windows in the at least one analysis window satisfying a preset condition.

5. The method according to claim 4, wherein the preset number of analysis windows are constant analysis windows.

6. The method according to claim 4, further comprising:

respectively setting, by the at least one processor of the howling detection apparatus, a first counting value and a second counting value to preset initial values;

adding, by the at least one processor of the howling detection apparatus, a preset first step length value to the first counting value in response to a comparison result between the howling indicator value of an analysis window of the at least one analysis window and the howling threshold satisfying the preset condition; and adding, by the at least one processor of the howling detection apparatus, a preset second step length value to the second counting value in response to the comparison result between the howling indicator value of the analysis window of the at least one analysis window and the howling threshold not satisfying the preset condition, wherein the determining that the howling occurs comprises:

determining that the howling occurs when the first counting value is equal to a preset first value; and returning the first counting value to an initial value when the second counting value reaches a preset second value.

7. The method according to claim 4, wherein the determining the howling indicator value of the at least one analysis window comprises:

determining a spectral entropy of a signal in the at least one analysis window according to the perceptual energy indicator value of each frequency in the at least one analysis window by using the following formula:

$$H = \sum_{m=0}^{M-1} Pd(m)\log\frac{1}{Pd(m)},$$

wherein $$Pd(m) = p'(m) \bigg/ \sum_{j=0}^{M-1} p'(j)$$

represents a probability density function of the signal in the at least one analysis window at an $m^{th}$ frequency; $p'(m)=p(m) \times cof(fc(m))$ represents a perceptual energy indicator value of the signal in the at least one analysis window at the frequency m; p(m) represents a signal energy indicator value of the frequency m in the at least one analysis window; cof(fc(nm)) represents a perceptual coefficient corresponding to the frequency m; fc(m) represents a central frequency of the frequency m, wherein m=0, 1, 2, . . . , M−1 and j=0, 1, 2, . . . , M−1; and M is a sum of preset frequencies; and the determining that the howling occurs based on the comparison results of the preset number of analysis windows comprises:

determining that the howling occurs in response to the spectral entropy of the signal in the preset number of analysis windows in the at least one analysis window being lower than the howling threshold.

8. The method according to claim 4, wherein the determining the howling indicator value of the at least one analysis window comprises:

determining a peak-to-average ratio of a signal in the at least one analysis window according to the perceptual energy indicator value of each frequency in the at least one analysis window:

$Rpm=Peak/PM$, wherein

Peak=Max(p'(m)) represents a peak value of the perceptual energy indicator value of each frequency in the at least one analysis window; $p'(m)=p(m) \times cof(fc(m))$ represents a perceptual energy indicator value of the signal in the at least one analysis window at a frequency m; p(m) represents a signal energy indicator value of the frequency m in the at least one analysis window; cof(fc(m)) represents a perceptual coefficient corresponding to the frequency m; fc(m) represents a central frequency of the frequency m;

$$PM = \frac{1}{M} \times \sum_{j=0}^{M-1} p'(m)$$

represents an average value of the perceptual energy indicator value of each frequency in the at least one analysis window, wherein m=0, 1, 2, . . . , M−1 and j=0, 1, 2, . . . , M−1; and M is a sum of preset frequencies; and the determining that the howling occurs based on the comparison results of the preset number of analysis windows comprises:

determining that the howling occurs in response to the peak-to-average ratio of the signal in the preset number of analysis windows in the at least one analysis window being higher than the howling threshold.

9. A howling detection apparatus, comprising at least one processor and at least one memory, the at least one memory storing a series of computer readable instructions being capable of causing the at least one processor to perform:

performing window separation processing on an audio signal to obtain a plurality of analysis windows;

obtaining a signal energy indicator value of each preset frequency in at least one analysis window by using a perceptual coefficient corresponding to each frequency, to obtain a perceptual energy indicator value of each frequency, the perceptual coefficient corresponding to each frequency indicating a sensitivity of a human ear to a sound of each frequency; and determining whether howling occurs according to the perceptual energy indicator value of each frequency in the at least one analysis window.

10. The apparatus according to claim 9, wherein the computer readable instructions are capable of causing the at least one processor to perform:

determining a howling indicator value of the at least one analysis window according to the perceptual energy indicator value of each frequency in the at least one analysis window, wherein the howling indicator value indicates a probability that the howling occurs;

comparing the howling indicator value of the at least one analysis window with a howling threshold; and determining that the howling occurs based on comparison results of a preset number of analysis windows in the at least one analysis window satisfying a preset condition.

11. The apparatus according to claim 10, wherein the preset number of analysis windows are constant analysis windows.

12. The apparatus according to claim 10, wherein the computer readable instructions are capable of causing the at least one processor to perform:

respectively setting a first counting value and a second counting value to preset initial values;

adding a preset first step length value to the first counting value in response to a comparison result between the howling indicator value of an analysis window of the at least one analysis window and the howling threshold satisfying the preset condition; and adding a preset second step length value to the second counting value in response to the comparison result between the howling indicator value of the analysis window of the at least one analysis window and the howling threshold not satisfying the preset condition, wherein the determining that the howling occurs comprises:

determining that the howling occurs when the first counting value is equal to a preset first value; and returning the first counting value to an initial value when the second counting value reaches a preset second value.

13. A non-transitory computer readable storage medium, storing a series of computer readable instructions, the computer readable instructions being capable of causing one or more processors to perform:

performing window separation processing on an audio signal to obtain a plurality of analysis windows;

obtaining a signal energy indicator value of each preset frequency in at least one analysis window by using a perceptual coefficient corresponding to each frequency, to obtain a perceptual energy indicator value of each frequency, the perceptual coefficient corresponding to each frequency indicating a sensitivity of a human ear to a sound of each frequency; and determining whether howling occurs according to the perceptual energy indicator value of each frequency in the at least one analysis window.

14. The non-transitory computer readable storage medium according to claim 13, wherein:

in a pair of a first frequency and a second frequency in a sensitive frequency range of the human ear, a perceptual coefficient corresponding to the first frequency is higher than a perceptual coefficient corresponding to the second frequency, the first frequency being higher than the second frequency.

15. The non-transitory computer readable storage medium according to claim 13, wherein a relationship between the perceptual coefficient and each frequency corresponds to an equal loudness curve.

16. The non-transitory computer readable storage medium according to claim 13, wherein the determining whether howling occurs comprises:

determining a howling indicator value of the at least one analysis window according to the perceptual energy indicator value of each frequency in the at least one analysis window, wherein the howling indicator value indicates a probability that the howling occurs; and comparing the howling indicator value of the at least one analysis window with a howling threshold; and determining that the howling occurs based on comparison results of a preset number of analysis windows in the at least one analysis window satisfying a preset condition.

17. The non-transitory computer readable storage medium according to claim 16, wherein the preset number of analysis windows are constant analysis windows.

18. The non-transitory computer readable storage medium according to claim 16, wherein the computer readable instructions are capable of causing the one or more processors to perform:

respectively setting a first counting value and a second counting value to preset initial values;

adding a preset first step length value to the first counting value in response to a comparison result between the howling indicator value of an analysis window of the at least one analysis window and the howling threshold satisfying the preset condition; and adding a preset second step length value to the second counting value in response to the comparison result between the howling indicator value of the analysis window of the at least one analysis window and the howling threshold not satisfying the preset condition, wherein the determining that the howling occurs comprises:

determining that the howling occurs when the first counting value is equal to a preset first value; and returning the first counting value to an initial value when the second counting value reaches a preset second value.

19. The non-transitory computer readable storage medium according to claim 16, wherein the determining the howling indicator value of the at least one analysis window comprises:

determining a spectral entropy of a signal in the at least one analysis window according to the perceptual energy indicator value of each frequency in the at least one analysis window by using the following formula:

$$H = \sum_{m=0}^{M-1} Pd(m) \log \frac{1}{Pd(m)},$$

wherein $$Pd(m) = p'(m) \bigg/ \sum_{j=0}^{M-1} p'(j)$$

represents a probability density function of the signal in the at least one analysis window at an $m^{th}$ frequency; $p'(m)=p(m)\times cof(fc(m))$ represents a perceptual energy indicator value of the signal in the at least one analysis window at the frequency m; p(m) represents a signal energy indicator value of the frequency m in the at least one analysis window; cof(fc(m)) represents a perceptual coefficient corresponding to the frequency m; fc(m) represents a central frequency of the frequency m, wherein m=0, 1, 2, . . . , M−1 and j=0, 1, 2, . . . , M−1; and M is a sum of preset frequencies; and the determining that the howling occurs based on the comparison results of the preset number of analysis windows comprises:

determining that the howling occurs in response to the spectral entropy of the signal in the preset number of analysis windows in the at least one analysis window being lower than the howling threshold.

20. The non-transitory computer readable storage medium according to claim 16, wherein the determining the howling indicator value of the at least one analysis window comprises:

determining a peak-to-average ratio of a signal in the at least one analysis window according to the perceptual energy indicator value of each frequency in the at least one analysis window:

Rpm=Peak/PM, wherein

Peak=Max(p'(m)) represents a peak value of the perceptual energy indicator value of each frequency in the at least one analysis window; $p'(m)=p(m)\times cof(fc(m))$ represents a perceptual energy indicator value of the signal in the at least one analysis window at a frequency m; p(m) represents a signal energy indicator value of the frequency m in the at least one analysis window; cof(fc(m)) represents a perceptual coefficient corresponding to the frequency m; fc(m) represents a central frequency of the frequency m;

$$PM = \frac{1}{M} \times \sum_{j=0}^{M-1} p'(m)$$

represents an average value of the perceptual energy indicator value of each frequency in the at least one analysis window, wherein m=0, 1, 2, . . . , M−1 and j=0, 1, 2, . . . , M−1; and M is a sum of preset frequencies; and the determining that the howling occurs based on the comparison results of the preset number of analysis windows comprises:

determining that the howling occurs in response to the peak-to-average ratio of the signal in the preset number of analysis windows in the at least one analysis window being higher than the howling threshold.

* * * * *